(12) United States Patent
Kim

(10) Patent No.: US 8,780,603 B2
(45) Date of Patent: Jul. 15, 2014

(54) SEMICONDUCTOR DEVICE INCLUDING ELECTRICAL FUSE

(75) Inventor: Hong-Jung Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 13/461,144

(22) Filed: May 1, 2012

(65) Prior Publication Data

US 2013/0163347 A1    Jun. 27, 2013

(30) Foreign Application Priority Data

Dec. 23, 2011  (KR) .................. 10-2011-0140969

(51) Int. Cl.
*G11C 17/12*   (2006.01)

(52) U.S. Cl.
USPC ........................................... 365/96; 365/200

(58) Field of Classification Search
USPC .................................................. 365/96, 200
See application file for complete search history.

(56) References Cited

U.S. PATENT DOCUMENTS

2012/0194243 A1*  8/2012  Choi et al. .................. 327/161

\* cited by examiner

*Primary Examiner* — Hoai V Ho
(74) *Attorney, Agent, or Firm* — IP & T Group LLP

(57) ABSTRACT

A semiconductor device includes: a plurality of repair fuse circuits configured to each program a repair target address; and an enable signal generation circuit configured to generate at least one enable signal in response to a source signal and provide the enable signal to each of the repair fuse circuits in common. Since the semiconductor device may iteratively generate a rupture enable signal through a feedback scheme, the area occupied by a circuit, such as a shift register or a D flip-flop may be saved.

3 Claims, 7 Drawing Sheets

SEMICONDUCTOR DEVICE INCLUDING ELECTRICAL FUSE

CROSS-REFERENCE TO RELATED APPLICATIONS

The present application claims priority of Korean Patent Application No. 10-2011-0140969, filed on Dec. 23, 2011, which is incorporated herein by reference in its entirety.

BACKGROUND

1. Field

Exemplary embodiments of the present invention relate to a semiconductor designing technology, and more particularly, to a semiconductor device including an electrical fuse.

2. Description of the Related Art

Semiconductor memory devices such as a Dynamic Random Access Memory (DRAM) device generally use electrical fuses to protect against bit failures that may frequently occur after packaging. For such purposes, a semiconductor memory device uses a number of electrical fuses equal to the number of bits in a fail address (that is, the address of a failed memory/erroneous memory).

FIG. 1 is a block diagram illustrating a conventional semiconductor device capable of saving 1 bit of data. Here, for illustration purposes, it is assumed that the address corresponding to the memory space for storing the 1 bit data is formed of four bits.

Referring to FIG. 1, the semiconductor device 10 includes a shifting unit 11, a latch unit 13, and a fuse unit 15. The shifting unit 11 sequentially generates first to fourth rupture enable signals EN1 to EN4 in response to an initialization signal RST, a rupture source signal SOUR, and a shifting control signal CMD. The latch unit 13 individually latches the four repair target address bits A1 to A4 in response to a latch control signal STOREP. The fuse unit 15 outputs four programmed address bits RA1, RA2, RA3 and RA4 that correspond to the four repair target address bits A1 to A4 and are programmed in response to the first to fourth rupture enable signals EN1 to EN4 and four latch address bits AQ1 to AQ4 that are outputted from the latch unit 11

The semiconductor device 10 having the above-described structure may have a memory storage capacity of one bit. Hereinafter, a semiconductor device having a memory storage capacity of two bits is illustrated.

FIG. 2 is a block diagram illustrating a conventional semiconductor device having a memory storage capacity of two bits.

Referring to FIG. 2, the semiconductor device 20 includes a shifting unit 21, a latch unit 23, a first fuse unit 25, and a second fuse unit 27. The shifting unit 21 sequentially generates first to eighth rupture enable signals EN1 to EN8 in response to an initialization signal RST, a rupture source signal SOUR, and a shifting control signal CMD. The latch unit 23 individually latches the four bits A1 to A4 of a first repair target address and the four bits B1 to B4 of a second repair target address in response to a latch control signal STOREP. The first fuse unit 25 outputs four first programmed address bits RA1, RA2, RA3 and RA4 that correspond to the four first repair target address bits A1 to A4 and are programmed in response to the first to fourth rupture enable signals EN1 to EN4 and four first latch address bits AQ1 to AQ4 that are outputted from the latch unit 23. The second fuse unit 27 outputs four second programmed address bits RB1, RB2, RB3 and RB4 that correspond to the four second repair target address bits B1 to B4 and are programmed in response to the fifth to eighth rupture enable signals EN5 to EN8 and four second latch address bits BQ1 to BQ4 that are outputted from the latch unit 23.

The semiconductor devices 10 and 20 having the above-described structure may sequentially program the programmed address RB1, RB2, RB3 and RB4 that corresponds to the repair target address A1 to A4 or B1 to B4 easily by using the shifting unit 11 or 21 that receives a shifting control signal CMD which toggles.

The semiconductor devices 10 and 20 having the above-described structure occupy more and more space as the memory storage capacity becomes greater. More specifically, the number of bits of the repair target address A1 to A4 or B1 to B4 is increased as the memory storage capacity is increased. Also, since the multiple rupture enable signals EN1 to ENK, where K is a multiple of '4', is to be sequentially generated according to the increasing number of bits of the repair target address A1 to A4 or B1 to B4, the number of shift registers included in the shifting unit 11 or 21 is increased in proportion as well. Therefore, the conventional semiconductor devices 10 and 20 have increased circuit spaces according to the number of circuits, e.g., shift registers, that increases in proportion to the increase in the memory storage capacity.

SUMMARY

An embodiment of the present invention is directed to a semiconductor device having a minimum area for a memory stage circuit.

In accordance with an embodiment of the present invention, a semiconductor device includes: a plurality of repair fuse circuits configured to each program a repair target address; and an enable signal generation circuit configured to generate at least one enable signal in response to a source signal and provide the enable signal to each of the repair fuse circuits in common.

In accordance with another embodiment of the present invention, a semiconductor device includes: a shifting unit configured to sequentially generate N rupture enable signals in response to a rupture source signal and a shifting control signal, wherein N is an integer equal to or greater than 1 and the shifting unit is further configured to iteratively generate the N rupture enable signals in response to an iterative generation signal; a feedback unit configured to feedback and provide a lastly generated rupture enable signal among the N rupture enable signals as the iterative generation signal; and a plurality of repair fuse circuits configured to program a repair target address having N bits in response to the N rupture enable signals and a selection enable signal.

In accordance with yet another embodiment of the present invention, a semiconductor device includes: a rupture enable signal generation block configured to iteratively generate N rupture enable signals M times in response to a rupture source signal, wherein N and M are integers equal to or greater than 1; M unit latch blocks configured to latch N bits of a repair target address, respectively, in response to a latch control signal; M unit rupture signal generation blocks configured to respectively generate N rupture signals in response to the N rupture enable signals and the latched N bit addresses outputted from the M unit latch blocks, wherein the N rupture signals are sequentially generated on a unit block basis in response to a selection enable signal; and M unit fuse blocks configured to be programmed in response to the N rupture signals that are outputted from the unit rupture signal generation blocks.

DETAILED DESCRIPTION

Figure 1:
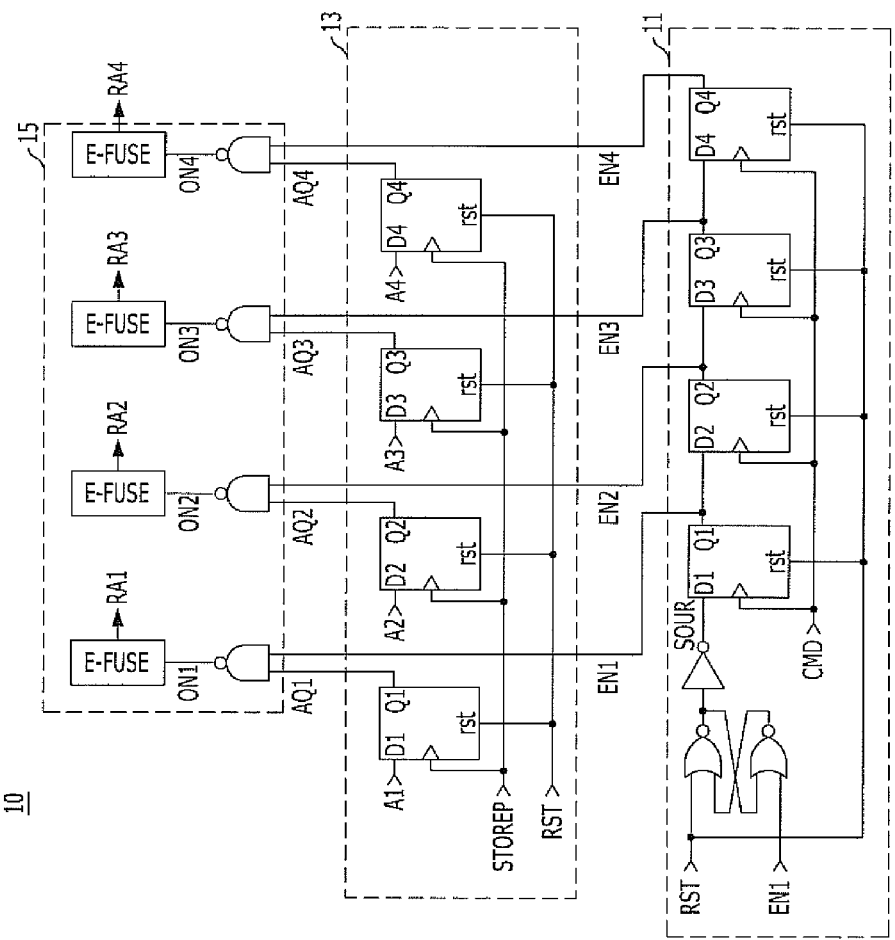
FIG. 1 is a block diagram illustrating a conventional semiconductor device for saving memory capacity of one bit.
Figure 2:
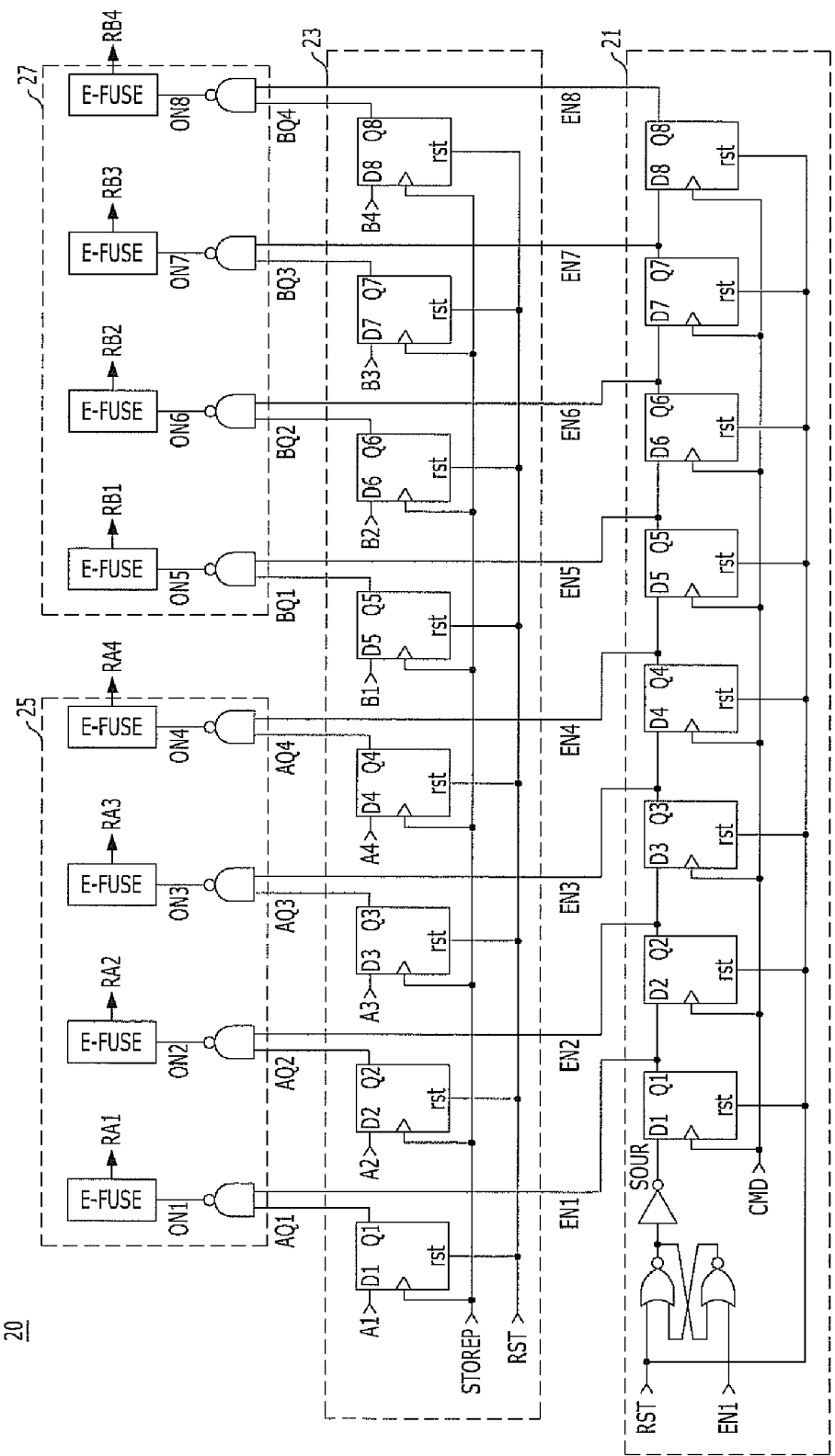
FIG. 2 is a block diagram illustrating a conventional semiconductor device for saving memory capacity of two bits.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

According to an embodiment of the present invention, while a case where two repair fuse circuits are used for a memory storage capacity of two bits of data, the present invention is not limited to such disclosure and may be used for another memory storage capacity such as four bits of data.

Figure 3:
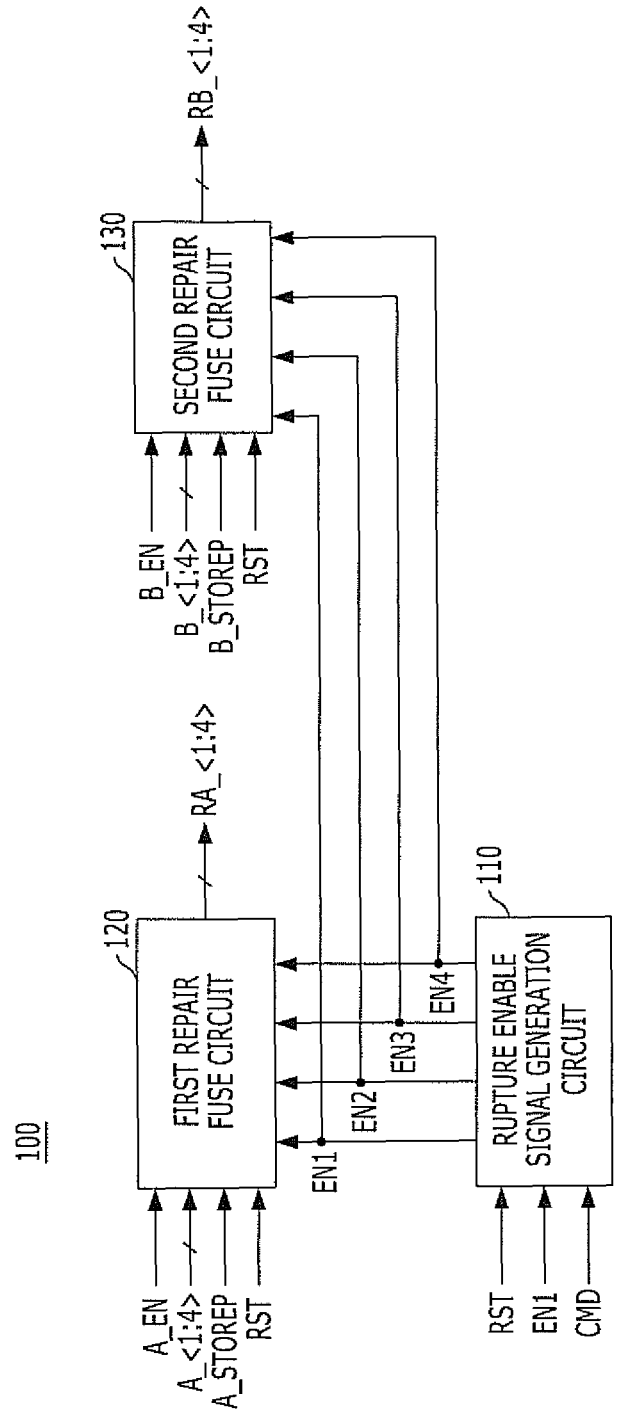
FIG. 3 is a block diagram illustrating a semiconductor device in accordance with an embodiment of the present invention.

FIG. 3 is a block diagram illustrating a semiconductor device 100 in accordance with an embodiment of the present invention.

Referring to FIG. 3, the semiconductor device 100 includes a rupture enable signal generation circuit 110, a first repair fuse circuit 120, and a second repair fuse circuit 130. The rupture enable signal generation circuit 110 iteratively generates first to fourth rupture enable signals EN1 to EN4 in response to an initialization signal RST, a rupture source signal SOUR (FIG. 4), and a shifting control signal CMD. The first repair fuse circuit 120 sequentially programs the four bits of a first repair target address A_<1:4> in response to the first to fourth rupture enable signals EN1 to EN4, a first selection enable signal A_EN, and a first latch control signal A_STOREP. The second repair fuse circuit 130 sequentially programs the four bits of a second repair target address B_<1:4> in response to the first to fourth rupture enable signals EN1 to EN4, a second selection enable signal B_EN, and a second latch control signal B_STOREP.

It may be seen that one rupture enable signal generation circuit 110 controls both the first and second repair fuse circuits 120 and 130. More specifically, the semiconductor device 100 has a structure where the first repair fuse circuit 120 and the second repair fuse circuit 130 receive the first to fourth rupture enable signals EN1 to EN4 in common.

Figure 4:
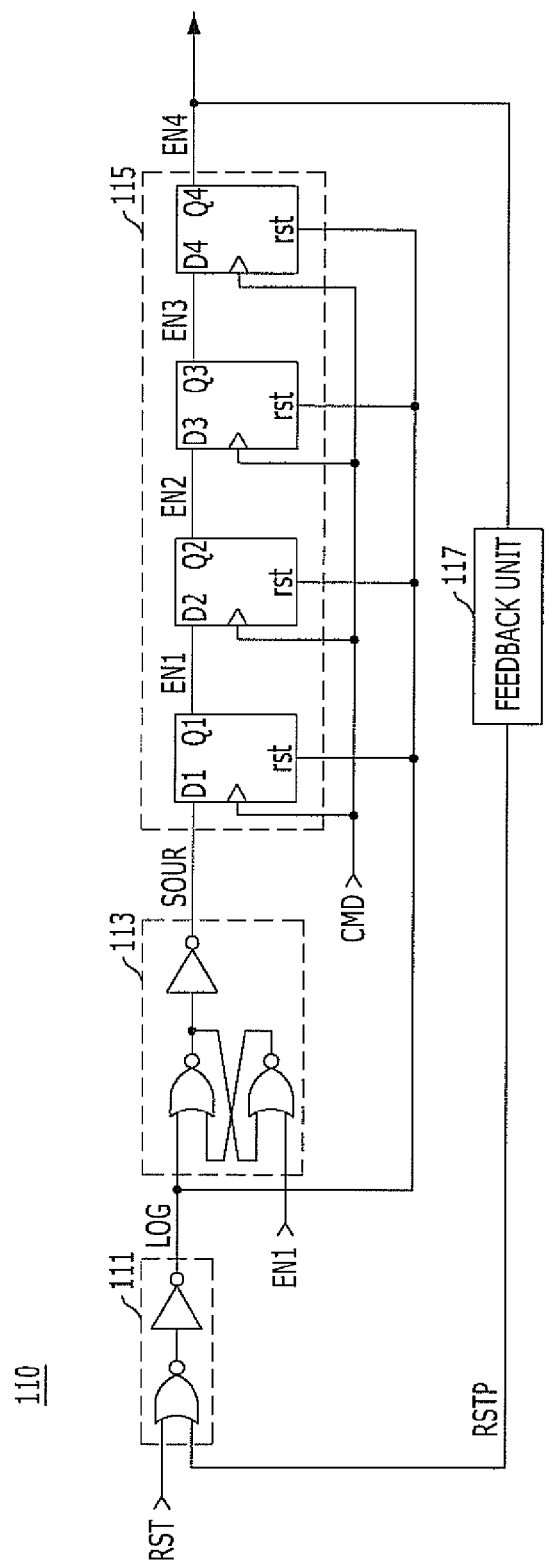
FIG. 4 is an internal block diagram illustrating a rupture enable signal generation circuit of FIG. 3.
Figure 5:
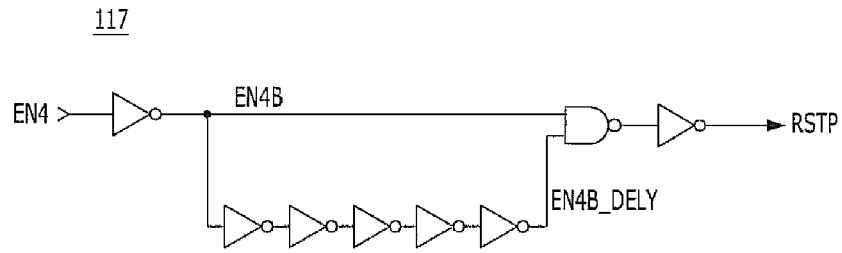
FIG. 5 is an internal block diagram illustrating a feedback unit of FIG. 4.

FIG. 4 is an internal block diagram illustrating a rupture enable signal generation circuit 110 of FIG. 3. FIG. 5 is an internal block diagram illustrating a feedback unit 117 of FIG. 4.

Referring to FIG. 4, the rupture enable signal generation circuit 110 includes a logic operation unit 111, an SR latch unit 113, a shifting unit 115, and a feedback unit 117. The logic operation unit 111 performs a logic operation on the initialization signal RST and an iterative generation signal RSTP. The SR latch unit 113 generates a rupture source signal SOUR in response to a first rupture enable signal EN1 and a logic operation signal LOG that is outputted from the logic operation unit 111. The shifting unit 115 sequentially generates first to fourth rupture enable signals EN1 to EN4 in response to the rupture source signal SOUR and a shifting control signal CMD. The generation of the first to fourth rupture enable signals EN1 to EN4 in response to the rupture source signal SOUR and the shifting control signal CMD is performed iteratively at every designated period. The feedback unit 117 outputs the iterative generation signal RSTP in response to the fourth rupture enable signal EN4.

The logic operation unit 111 includes a NOR gate performing a NOR operation on the initialization signal RST and the iterative generation signal RSTP and an inverter for inverting an output of the NOR gate and outputting the logic operation signal LOG.

The SR latch unit 113 includes an SR latch that is set in response to the logic operation signal LOG and reset in response to the first rupture enable signal EN1 and an inverter for generating the rupture source signal SOUR by inverting the output of the SR latch.

The shifting unit 115 includes first to fourth D-flipflops for outputting the first to fourth rupture enable signals EN1 to EN4 by shifting the rupture source signal SOUR according to the shifting control signal CMD, and the first to fourth D-flipflops are initialized in response to the logic operation signal LOG.

The feedback unit 117 includes a first inverter, an odd number of second inverters, a NAND gate, and a third inverter. The first inverter outputs an inverted fourth rupture enable signal EN4B by inverting the fourth rupture enable signal EN4. The odd number of second inverters delay the inverted fourth rupture enable signal EN4B by a desired period of time and output a delayed fourth rupture enable signal EN4B_DELY having the original logic level. The NAND gate performs a NAND operation on the inverted fourth rupture enable signal EN4B and the delayed fourth rupture enable signal EN4B_DELY. The third inverter outputs the iterative generation signal RSTP by inverting the output of the NAND gate.

Figure 6:
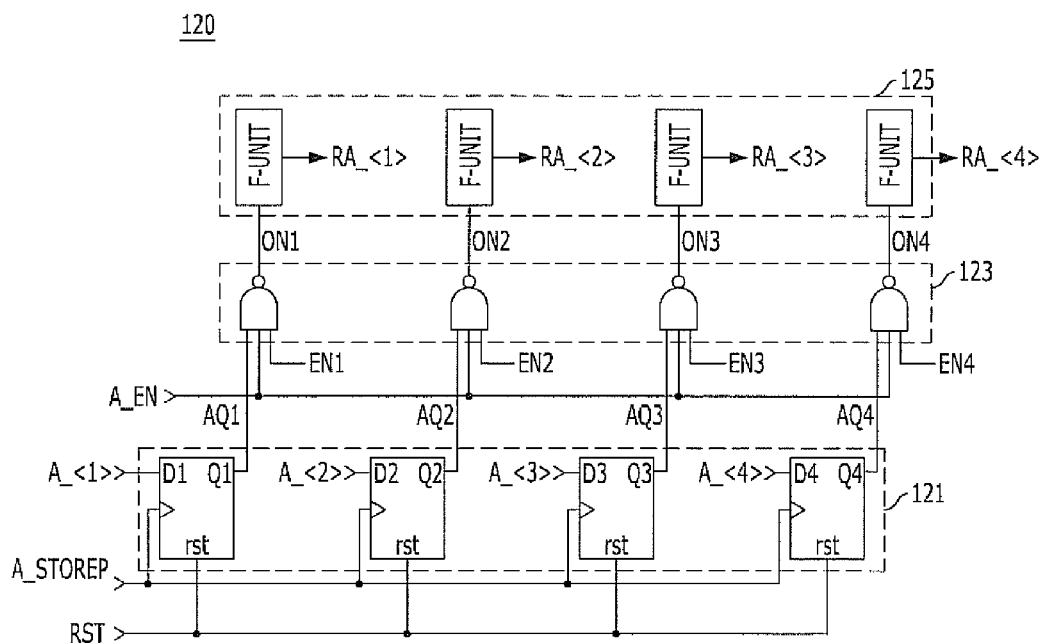
FIG. 6 is an internal block diagram illustrating a first repair fuse circuit of FIG. 3.
Figure 7:
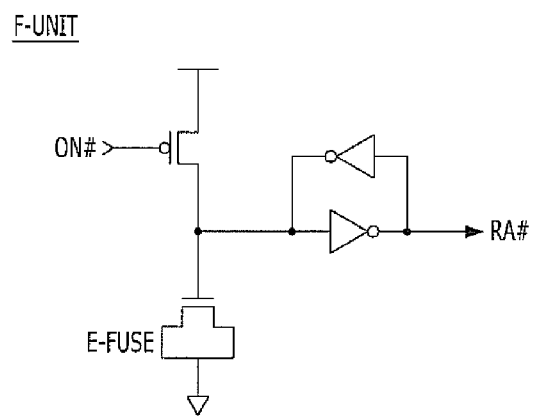
FIG. 7 is an internal block diagram illustrating a fuse unit of FIG. 6.

FIG. 6 is an internal block diagram illustrating a first repair fuse circuit of FIG. 3, and FIG. 7 is an internal block diagram illustrating a fuse unit of FIG. 6.

Referring to FIG. 6, the first repair fuse circuit 120 includes a first unit latch block 121, a first unit rupture signal generation block 123, and a first unit fuse block 125. The first unit latch block 121 is initialized in response to the initialization signal RST and individually latches the four bits of a first repair target address A_<1:4> in response to a first latch control signal A_STOREP. The first unit rupture signal generation block 123 generates first to fourth rupture signals ON1, ON2, ON3 and ON4 that correspond to the four bits of a first latch address AQ1, AQ2, AQ3 and AQ4 outputted from the first unit latch block 121 in response to a first selection enable signal A_EN and the first to fourth rupture enable signals EN1 to EN4. The first unit fuse block 125 generates a 4-bit first repair address RA_<1:4> corresponding to the 4-bit first repair target address A_<1:4> in response to the first to fourth rupture signals ON1, ON2, ON3 and ON4.

The first unit latch block 121 includes four D-flipflops that latch the four bits of the first repair target address A_<1:4>, respectively, in synchronization with the first latch control signal A_STOREP, and are initialized in response to the initialization signal RST.

The first unit rupture signal generation block 123 includes four NAND gates for outputting the first to fourth rupture signals ON1, ON2, ON3 and ON4 by performing a NAND operation on the first selection enable signal A_EN, the first to fourth rupture enable signals EN1 to EN4, and the first latch address AQ1, AQ2, AQ3 and AQ4.

The first unit fuse block 125 includes four first fuse units F_UNIT that are programmed in response to first to fourth rupture signals ON1, ON2, ON3 and ON4, and respectively output the four bits of the first latch address AQ1, AQ2, AQ3 and AQ4. The four first fuse units F_UNIT have the same structure, and this is illustrated in FIG. 7. Referring to FIG. 7, each of the first fuse units includes a PMOS transistor, an electrical fuse (e-fuse), and a latch. The PMOS transistor includes a gate for receiving a random rupture signal ON# among the first to fourth rupture signals ON1, ON2, ON3 and ON4, and a source and a drain coupled between a high power voltage terminal and a first coupling terminal. The e-fuse is coupled between the first coupling terminal and a low power voltage terminal. The latch is coupled between the first coupling terminal and an output terminal for outputting a random bit of a repair address RA# among the bits of the repair address RA1, RA2, RA3 and RA4.

Figure 8:
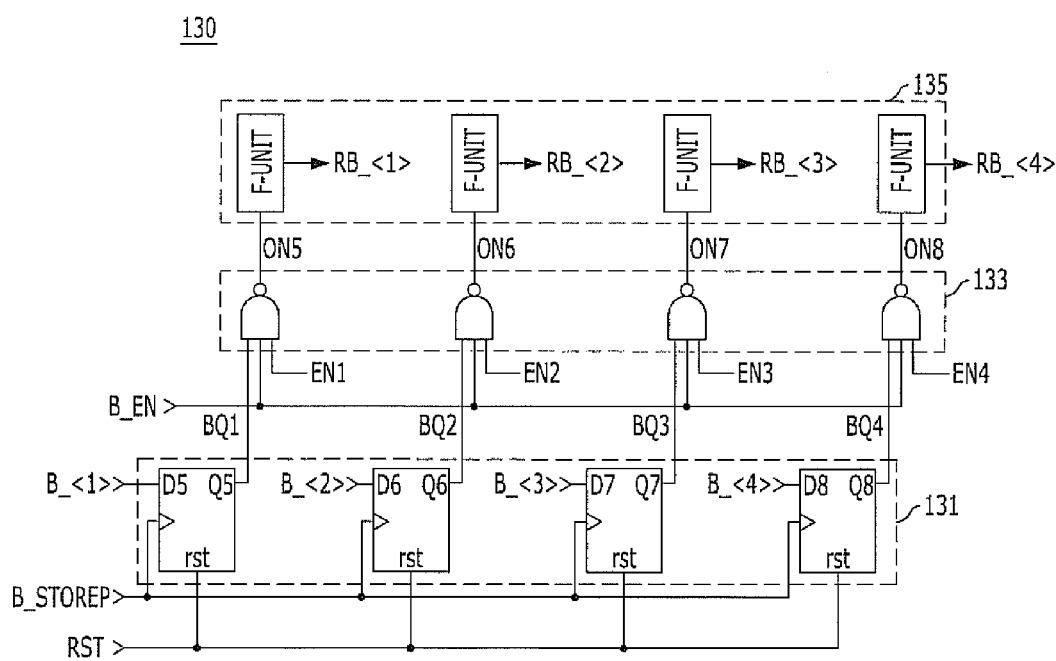
FIG. 8 is an internal block diagram illustrating a second repair fuse circuit of FIG. 3.

FIG. 8 is an internal block diagram illustrating the second repair fuse circuit 130 of FIG. 3.

Referring to FIG. 8, the second repair fuse circuit 130 includes a second unit latch block 131, a second unit rupture signal generation block 133, and a second unit fuse block 135. The second unit latch block 131 is initialized in response to the initialization signal RST and individually latches the four bits of a second repair target address B_<1:4> in response to a second latch control signal B_STOREP. The second unit rupture signal generation block 133 generates fifth to eighth rupture signals ON5, ON6, ON7 and ON8 that correspond to the four bits of a second latch address BQ1, BQ2, BQ3 and BQ4 outputted from the second unit latch block 131 in response to a second selection enable signal A_EN and the first to fourth rupture enable signals EN1 to EN4. The second unit fuse block 135 generates a 4-bit second repair address RB_<1:4> corresponding to the 4-bit second repair target address B_<1:4> in response to the fifth to eighth rupture signals ON5, ON6, ON7 and ON8.

The second unit latch block 131 includes four D-flipflops that latch the four bits of the second repair target address B_<1:4>, respectively, in synchronization with the second latch control signal B_STOREP, and are initialized in response to the initialization signal RST.

The second unit rupture signal generation block 133 includes four NAND gates for outputting the fifth to eighth rupture signals ON5, ON6, ON7 and ON8 by performing a NAND operation on the second selection enable signal B_EN, the first to fourth rupture enable signals N1 to EN4, and the second latch address BQ1, BQ2, BQ3 and BQ4.

The second unit fuse block 135 includes four second fuse units F_UNIT that are programmed in response to fifth to eighth rupture signals ON5, ON6, ON7 and ON8, and respectively output the four bits of the second latch address BQ1, BQ2, BQ3 and BQ4. Since the four second fuse units F_UNIT have the same structure as that of the first fuse units F_UNIT illustrated in FIG. 6, detailed description thereof is omitted herein (refer to FIG. 7).

Hereafter, the operation of the semiconductor device 100 having the above-described structure in accordance with the embodiment of the present invention is described with reference to FIG. 9.

Figure 9:
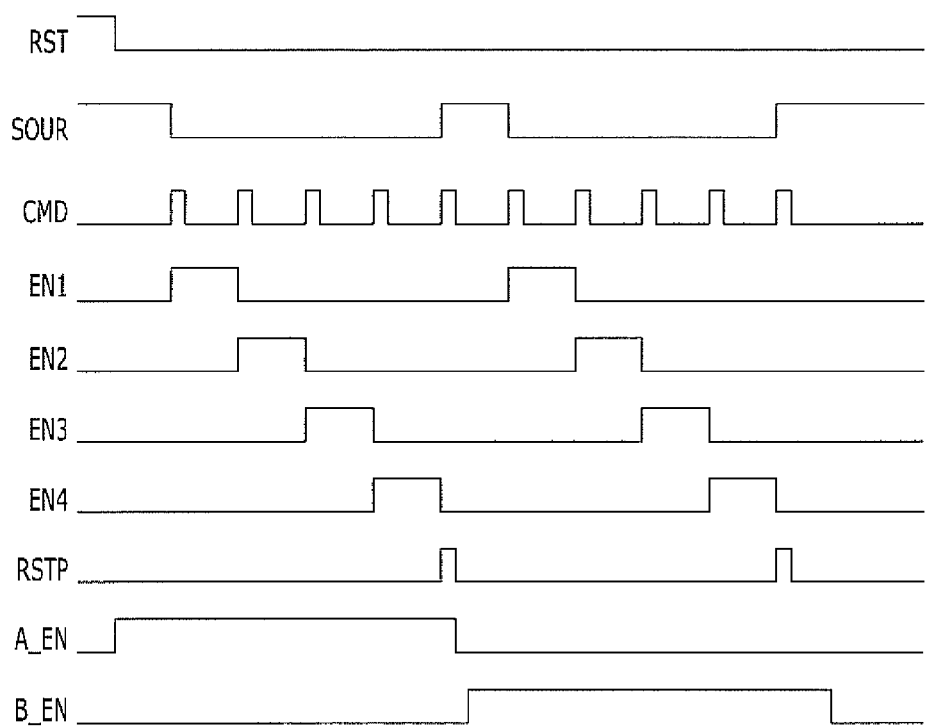
FIG. 9 is a timing diagram describing an operation of the semiconductor device shown in FIG. 3.

FIG. 9 is a timing diagram describing an operation of the semiconductor device shown in FIG. 3.

Referring to FIG. 9, as the initialization signal RST transitions from a logic high level to a logic low level, the rupture enable signal generation circuit 110, the first repair fuse circuit 120, and the second repair fuse circuit 130 are initialized and subsequently wait in a normal operation mode. Also, the rupture source signal SOUR outputted from the SR latch unit 113 is latched to a logic high level.

When the shifting control signal CMD begins toggling, the shifting unit 115 sequentially generates the first to fourth rupture enable signals EN1 to EN4 in synchronization with a rising edge of the shifting control signal CMD. More specifically, the first rupture enable signal EN1 transitions to a logic high level according to the logic high level of the rupture source signal SOUR in synchronization with the first rising edge of the shifting control signal CMD and transitions to a logic low level according to the logic low level of the rupture source signal SOUR in synchronization with the second rising edge of the shifting control signal CMD. In short, the first rupture enable signal EN1 is enabled according to the first rising edge of the shifting control signal CMD and disabled according to the second rising edge of the shifting control signal CMD. Meanwhile, the rupture source signal SOUR is reset, which is an operation characteristic of the SR latch unit 113, when the first rupture enable signal EN1 transitions to a logic high level. As the first rupture enable signal EN1 is shifted, the second to fourth rupture enable signals EN2 to EN4 are sequentially generated.

Subsequently, the feedback unit 117 outputs the iterative generation signal RSTP having a pulse of a logic high level at a time when the fourth rupture enable signal EN4 is disabled in response to the fourth rupture enable signal EN4, which is a time when the fourth rupture enable signal EN4 transitions to a logic low level.

The SR latch unit 113 changes and maintains the rupture source signal SOUR at the logic high level in response to the iterative generation signal RSTP having pulses at a logic high level.

Accordingly, the shifting unit 115 sequentially generates the first to fourth rupture enable signals EN1 to EN4 iteratively in synchronization with a rising edge of the shifting control signal CMD. Since the process of sequentially generating the first to fourth rupture enable signals EN1 to EN4 is the same as the generation process described before, detailed description thereof is omitted herein.

Meanwhile, since the number of toggling/logic level switches of the shifting control signal CMD is limited, the number of iterative generations in the shifting unit 115 is also limited. For example, when a shifting control signal CMD having 10 togglings is applied, the shifting unit 115 iteratively generates the first to fourth rupture enable signals EN1 to EN4 two times.

In the meantime, while the first selection enable signal A_EN is enabled to a logic high level, the first repair fuse circuit 120 programs the first repair target address A_<1:4> having four bits according to the first to fourth rupture enable signals EN1 to EN4, which are generated before and regularly outputs a first repair address RA_<1:4> having four bits that corresponds to the first repair target address A_<1:4>. To be specific, as the first selection enable signal A_EN is enabled to a logic high level and the first to fourth rupture enable signals EN1 to EN4 are enabled to a logic high level while the 4-bit first repair target address A_<1:4> is latched to the first unit latch block 121 in response to the first latch control signal A_STOREP, the first unit rupture signal generation block 123 outputs the first to fourth rupture signals ON1, ON2, ON3 and ON4, and the e-fuses included in the 4 first fuse units F_UNIT are selectively ruptured according to the first to fourth rupture signals ON1, ON2, ON3 and ON4, and corresponding fuse rupture information is outputted as the 4-bit first repair address RA_<1:4>.

Also, while the second selection enable signal B_EN is enabled to a logic high level, the second repair fuse circuit 130 programs the second repair target address B_<1:4> having four bits according to the first to fourth rupture enable signals EN1 to EN4, which are iteratively generated, and regularly outputs a second repair address RB_<1:4> having four bits that corresponds to the 4-bit second repair target address B_<1:4>. To be specific, as the second selection enable signal B_EN is enabled to a logic high level and the first to fourth rupture enable signals EN1 to EN4 are enabled to a logic high level while the 4-bit second repair target address B_<1:4> is latched to the second unit latch block 131 in response to the second latch control signal B_STOREP, the second unit rupture signal generation block 133 outputs the fifth to eighth rupture signals ON5, ON6, ON7 and ON8, and the e-fuses included in the 4 second fuse units F_UNIT are selectively ruptured according to the fifth to eighth rupture signals ON5, ON6, ON7 and ON8, and corresponding fuse rupture information is outputted as the 4-bit second repair address RB_<1:4>.

Here, the first selection enable signal A_EN and the second selection enable signal B_EN may be externally received signals or internally generated signals. For example, the first selection enable signal A_EN and the second selection enable signal B_EN may be generated based on the initialization signal RST and the iterative generation signal RSTP.

According to the embodiment of the present invention, since a rupture enable signal may be iteratively generated through a feedback scheme, the area occupied by a circuit, such as a shift register or a D-flipflop, corresponding to the number of iteration may be saved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a plurality of repair fuse circuits configured to each program a repair target address in response to enable signals; and
an enable signal generation circuit configured to iteratively generate the enable signals in response to a source signal and the lastly generated enable signal among the enable signals and provide the enable signals to each of the repair fuse circuits in common.

2. The semiconductor device of claim 1, wherein the enable signal generation circuit is configured to iteratively generate N enable signals and N is an integer equal to or greater than 1.

3. The semiconductor device of claim 2, wherein each of the repair fuse circuits are each configured to sequentially program the repair target address having N bits in response to the N enable signals and a selection enable signal.

* * * * *